United States Patent
Kim et al.

(10) Patent No.: US 11,482,593 B2
(45) Date of Patent: Oct. 25, 2022

(54) COMPOSITION FOR DEPOSITING THIN FILM, MANUFACTURING METHOD FOR THIN FILM USING THE COMPOSITION, THIN FILM MANUFACTURED FROM THE COMPOSITION, AND SEMICONDUCTOR DEVICE INCLUDING THE THIN FILM

(71) Applicant: Samsung SDI Co., Ltd., Yongin-si (KR)

(72) Inventors: Yong Tae Kim, Suwon-si (KR); Bukeun Oh, Suwon-si (KR); Gyeong Ryeong Bak, Suwon-si (KR); Taegeun Seong, Suwon-si (KR); Sangkyun Im, Suwon-si (KR); Seol Hee Lim, Suwon-si (KR); Hwansung Cheon, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 45 days.

(21) Appl. No.: 17/064,454

(22) Filed: Oct. 6, 2020

(65) Prior Publication Data
US 2021/0111244 A1    Apr. 15, 2021

(30) Foreign Application Priority Data
Oct. 10, 2019   (KR) .................. 10-2019-0125525

(51) Int. Cl.
*H01L 27/108*    (2006.01)
*H01L 49/02*     (2006.01)
(Continued)

(52) U.S. Cl.
CPC ............ *H01L 28/56* (2013.01); *C09D 5/24* (2013.01); *C09D 7/63* (2018.01); *H01L 27/10805* (2013.01)

(58) Field of Classification Search
CPC ............ C09D 5/24; C09D 7/63; C23C 16/40; C23C 16/45553; H01L 27/10805; H01L 28/56
See application file for complete search history.

(56) References Cited

U.S. PATENT DOCUMENTS

| 7,108,747 B1 | 9/2006 | Leskela et al. |
| 2009/0074965 A1* | 3/2009 | Xu .................... C07F 17/00 204/192.1 |

(Continued)

FOREIGN PATENT DOCUMENTS

| JP | 2000-185917 A | 7/2000 |
| JP | 2002-525426 A | 8/2002 |

(Continued)

OTHER PUBLICATIONS

TW Office Action dated Apr. 20, 2021, for corresponding Taiwanese Application No. 109134587 (5 pages).

(Continued)

*Primary Examiner* — Mark Kopec
*Assistant Examiner* — Jaison P Thomas
(74) *Attorney, Agent, or Firm* — Lewis Roca Rothgerber Christie LLP

(57) ABSTRACT

Disclosed are a composition for depositing a thin film including an organometallic compound including strontium, barium, or a combination thereof; and at least one unshared electron pair-containing compound represented by Chemical Formula 1, a method of manufacturing a thin film using the composition for depositing the thin film, and the thin film manufactured from the composition for depositing the thin film, and a semiconductor device including the thin film.

18 Claims, 3 Drawing Sheets

(51) Int. Cl.
*C09D 7/63* (2018.01)
*C09D 5/24* (2006.01)

(56) References Cited

U.S. PATENT DOCUMENTS

| | | | | |
|---|---|---|---|---|
| 2013/0030191 A1* | 1/2013 | Bailey, III | ........ | C23C 16/45553 548/402 |
| 2013/0260025 A1* | 10/2013 | Norman | ............ | C23C 16/45553 427/126.3 |
| 2014/0295071 A1 | 10/2014 | Xu et al. | | |

FOREIGN PATENT DOCUMENTS

| | | |
|---|---|---|
| JP | 2004-203726 A | 7/2004 |
| JP | 2005-2099 A | 1/2005 |
| JP | 2011-001362 A | 1/2011 |
| JP | 2012151018 A * | 8/2012 |
| JP | 2013-214747 A | 10/2013 |
| KR | 10-1124722 B1 | 4/2012 |
| KR | 10-1349888 B1 | 1/2014 |
| KR | 10-1399552 B1 | 5/2014 |
| KR | 10-1488855 B1 | 2/2015 |
| KR | 10-1498732 B1 | 3/2015 |
| KR | 10-2016-0027244 A | 3/2016 |
| KR | 10-2016-0036661 A | 4/2016 |
| KR | 10-2019-0082248 A | 7/2019 |
| WO | WO 2012/053433 A1 | 4/2012 |
| WO | WO 2015/013630 A1 | 1/2015 |

OTHER PUBLICATIONS

Office Action dated Oct. 20, 2021, of the corresponding Japanese Patent Application No. 2020-171114, 6pp.
Office Action dated Apr. 19, 2022 of the corresponding Japanese Patent Application No. 2020-171114, 5pp.

* cited by examiner

COMPOSITION FOR DEPOSITING THIN FILM, MANUFACTURING METHOD FOR THIN FILM USING THE COMPOSITION, THIN FILM MANUFACTURED FROM THE COMPOSITION, AND SEMICONDUCTOR DEVICE INCLUDING THE THIN FILM

CROSS-REFERENCE TO RELATED APPLICATION

This application claims priority to and the benefit of Korean Patent Application No. 10-2019-0125525 filed in the Korean Intellectual Property Office on Oct. 10, 2019, the entire contents of which are hereby incorporated by reference.

BACKGROUND

1. Field

A composition for depositing a thin film, a manufacturing method for a thin film using the composition, a thin film manufactured from the composition for depositing the thin film, and a semiconductor device including the thin film are disclosed herein.

2. Description of the Related Art

Recently, the semiconductor industry has progressed from semiconductors having dimensions of hundreds of nanometers to ultra-fine technologies of semiconductors having dimensions of several to tens of nanometers. In order to realize such ultra-fine technology, a thin film having a high dielectric constant and low electrical resistance is essential.

However, due to a high integration of semiconductor devices, it is difficult to form a thin film by a physical vapor deposition process (PVD) as has been used in the past, such as, for example, a sputtering process. Accordingly, in recent years, the thin films have been formed by a chemical vapor deposition process (CVD) or an atomic layer deposition process (ALD).

In order to uniformly (e.g., substantially uniformly) form the thin film by a chemical vapor deposition process (CVD) or an atomic layer deposition process (ALD), a composition for depositing a thin film which is easily vaporized and thermally stable is required.

SUMMARY

An embodiment provides a composition for depositing a thin film, the composition having low viscosity and improved volatility.

Another embodiment provides a method of manufacturing a thin film using the composition for depositing the thin film.

Another embodiment provides a thin film manufactured from the composition for depositing the thin film.

Another embodiment provides a semiconductor device including the thin film.

According to an embodiment, a composition for depositing a thin film includes an organometallic compound including strontium, barium, or a combination thereof, and at least one unshared electron pair-containing compound represented by Chemical Formula 1.

$$R^1R^2R^3N \qquad \text{Chemical Formula 1}$$

In Chemical Formula 1, $R^1$ to $R^3$ are each independently a substituted or unsubstituted C3 to C15 alkyl group.

The organometallic compound may include a substituted or unsubstituted cyclopentadiene-based ligand, a substituted or unsubstituted β-diketonate-based ligand, a substituted or unsubstituted ketoiminate-based ligand, a substituted or unsubstituted pyrrole-based ligand, a substituted or unsubstituted imidazole-based ligand, a substituted or unsubstituted amidinate-based ligand, a substituted or unsubstituted alkoxide-based ligand, a substituted or unsubstituted amide-based ligand, or a combination thereof.

The organometallic compound may be represented by Chemical Formula 2.

$$M(A)_2 \qquad \text{Chemical Formula 2}$$

In Chemical Formula 2, M is Sr or Ba and A is derived from (or is) a compound represented by Chemical Formula 3, $$\text{Chemical Formula 3}$$

wherein in Chemical Formula 3, $R^a$ to $R^e$ are each independently hydrogen, or a substituted or unsubstituted C1 to C30 alkyl group.

At least one selected from $R^a$ to $R^e$ may be a substituted or unsubstituted C3 to C30 branched alkyl group.

In Chemical Formula 1, $R^1$ to $R^3$ may be the same.

$R^1$ to $R^3$ may each independently be a substituted or unsubstituted pentyl group, a substituted or unsubstituted hexyl group, a substituted or unsubstituted heptyl group, a substituted or unsubstituted octyl group, a substituted or unsubstituted nonyl group, or a substituted or unsubstituted decyl group.

The unshared electron pair-containing compound may be included in an amount in a range of about 10 wt % to about 90 wt % based on a total weight of the composition for depositing the thin film.

An equivalent ratio ($m^2/m^1$) of the organometallic compound ($m^1$) and the unshared electron pair-containing compound ($m^2$) may be in a range of about 0.1 to about 5.

When measured using a thermogravimetric analysis at 1 atmosphere of pressure under an Ar (argon) gas atmosphere, a difference between a temperature at which a 50% weight loss relative to an initial weight of the organometallic compound occurs and a temperature at which a 50% weight loss relative to an initial weight of the unshared electron pair-containing compound occurs may be less than or equal to about 90° C.

When measuring thermogravimetric analysis at 1 atmosphere of pressure under an Ar (argon) gas atmosphere, a temperature at which a 50% weight loss relative to an initial weight of the composition for depositing the thin film occurs may be lower than a temperature at which a 50% weight loss relative to an initial weight of the organometallic compound occurs, and a temperature at which a 50% weight loss relative to an initial weight of the unshared electron pair-containing compound occurs.

The composition for depositing the thin film may have a viscosity of less than or equal to about 500 cps.

The aforementioned composition for depositing the thin film may be a composition for depositing a first thin film.

According to another embodiment, a method of manufacturing a thin film includes vaporizing a composition for depositing a first thin film and depositing the vaporized composition for depositing the first thin film on a substrate to form the first thin film.

The method of manufacturing the thin film may further include vaporizing a composition for depositing a second thin film, and depositing the vaporized composition for depositing the second thin film on the substrate to form the second thin film, wherein the composition for depositing the second thin film may include a second organometallic compound including titanium, zirconium, hafnium, niobium, tantalum, or a combination thereof.

The vaporized composition for depositing the first thin film and the vaporized composition for depositing the second thin film may be deposited together or independently of each other on a substrate.

The vaporized composition for depositing the first thin film and the vaporized composition for depositing the second thin film may be deposited together or alternately on a substrate.

The vaporizing of the composition for depositing the first thin film may include heating the composition for depositing the first thin film at a temperature of less than or equal to about 300° C.

The depositing of the vaporized composition for depositing the first thin film on a substrate may further include reacting the vaporized composition for depositing the first thin film with a reaction gas, and the reaction gas may include aqueous vapor ($H_2O$), oxygen ($O_2$), ozone ($O_3$), plasma, hydrogen peroxide ($H_2O_2$), ammonia ($NH_3$), hydrazine ($N_2H_4$), or a combination thereof.

The depositing of the vaporized composition for depositing the first thin film on a substrate may be performed using an atomic layer deposition (ALD) or a metal organic chemical vapor deposition (MOCVD) method.

According to another embodiment, a thin film manufactured from the composition for depositing the thin film according to an embodiment is provided.

According to another embodiment, a semiconductor device including a thin film according to an embodiment is provided.

The composition for depositing the thin film may improve viscosity and volatility, and the thin film manufactured from the composition for depositing the thin film may provide a semiconductor device having high reliability for electrical properties.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
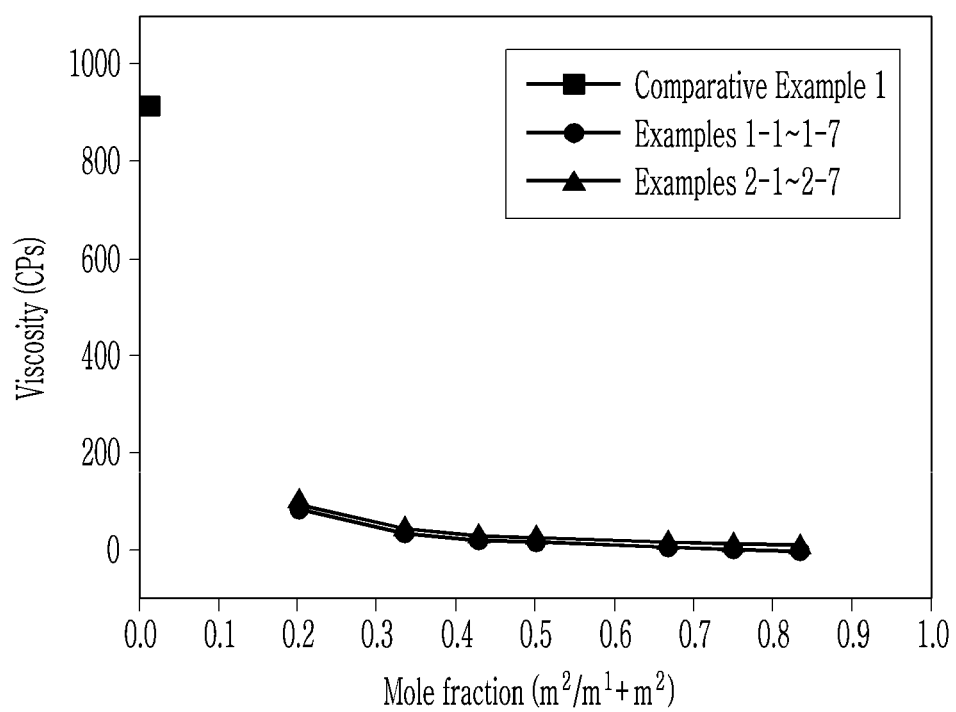
FIG. 1 is a graph showing viscosities of the compositions for depositing the thin film according to an amount of the organometallic compound of Chemical Formula 2-1, triheptylamine, and trioctylamine in the compositions for depositing the thin film according to Examples 1-1 to 1-7, Examples 2-1 to 2-7, and Comparative Example 1.

Hereinafter, embodiments of the present disclosure will be described in more detail so that those skilled in the art can easily implement the embodiments of the present disclosure. However, the subject matter of this disclosure may be embodied in many different forms and should not be construed as being limited to the example embodiments set forth herein.

Hereinafter, unless otherwise specified in the specification, when a part such as a layer, film, thin film, region, plate, etc. is said to be "on" another part, it includes not only the case where the other part is "immediately on" the part, but also includes cases where there is another part in the middle thereof (e.g., between the part and the other part).

Hereinafter, as used herein, when a definition is not otherwise provided, "a combination thereof" means a mixture of constituents, a composite, a coordination compound, a laminate, an alloy, and/or the like.

Hereinafter, as used herein, when a definition is not otherwise provided, "substituted" refers to replacement of a hydrogen atom by deuterium, a halogen, a hydroxy group, a cyano group, a nitro group, —NRR' (wherein, R and R' are independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" are independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C20 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof. As used herein, "unsubstituted" means that a hydrogen atom remains without being substituted with another substituent.

As used herein, when a definition is not otherwise provided, "hetero" means that one functional group includes 1 to 3 heteroatoms selected from N, O, S and P, and the remaining atoms are consistent with the functional group (e.g., the remaining atoms are carbon or hydrogen).

As used herein, when a definition is not otherwise provided, "alkyl group" refers to a linear or branched aliphatic hydrocarbon group. The alkyl group may be a "saturated alkyl group" without any double bond or triple bond. The alkyl group may be a C1 to C20 alkyl group. For example, the alkyl group may be a C1 to C10 alkyl group, a C1 to C8 alkyl group, a C1 to C6 alkyl group, or a C1 to C4 alkyl group. For example, the C1 to C4 alkyl group may be a methyl, ethyl, propyl, isopropyl, n-butyl, isobutyl, sec-butyl, or tert-butyl group.

As used herein, "saturated aliphatic hydrocarbon group" refers to a hydrocarbon group in which a bond between a carbon atom and another carbon atom in a molecule is formed of a single bond unless otherwise defined. The saturated aliphatic hydrocarbon group may be a C1 to C20 saturated aliphatic hydrocarbon group. For example, the saturated aliphatic hydrocarbon group may be a C1 to C10 saturated aliphatic hydrocarbon group, a C1 to C8 saturated aliphatic hydrocarbon group, a C1 to C6 saturated aliphatic hydrocarbon group C1 to C4 saturated aliphatic hydrocarbon group, or a C1 to C2 saturated aliphatic hydrocarbon group. For example, the C1 to C6 saturated aliphatic hydrocarbon group may be a methyl group, an ethyl group, a propyl group, an isopropyl group, an n-butyl group, an isobutyl group, a sec-butyl group, a 2,2-dimethylpropyl group, or a tert-butyl group.

As used herein, "amine group" refers to a primary amine group, a secondary amine group, or a tertiary amine group.

As used herein, "silyl amine group" refers to a primary amine group, a secondary amine group, or a tertiary amine group in which a nitrogen atom is substituted with one or more silyl groups, and a hydrogen atom in the silyl group may be replaced by a halogen (—F, —Cl, —Br, or —I), or a substituted or unsubstituted C1 to C20 alkyl group.

As used herein, "organometallic compound" refers to a compound including a chemical bond between a metal element and carbon, oxygen, or nitrogen, wherein the "chemical bond" refers to a covalent bond, an ionic bond, or a coordination bond.

As used herein, "ligand" refers to a molecule or ion that chemically bonds around a metal ion, and the molecule may be an organic molecule, wherein "chemically bonds" refers to a covalent bond, an ionic bond, or a coordination bond.

As used herein, the viscosity is based on a measurement under the following measurement conditions.
Viscosity Measurement Condition
  Viscosity meter: RVDV-II (BROOKFIELD Company)
  Spindle No.: CPA-40Z
  Torque/RPM: 20-80% Torque/1-100 RPM
  Measurement temperature (sample cup temperature): 25° C.

In order to manufacture a thin film having a high dielectric constant and high capacitance by a chemical vapor deposition process (CVD) or an atomic layer deposition process (ALD), an organometallic compound including an alkaline-earth metal is used. As used herein, "alkaline-earth metal" denotes a Group II element and may include, for example, strontium, barium, or a combination thereof. However, because the organometallic compound is mostly a solid or has a low vapor pressure, thin films are difficult to uniformly form in the chemical vapor deposition (CVD) process or the atomic layer deposition (ALD) process. Accordingly, a composition for depositing a thin film, which is thermally stable and easily vaporized as well as has a high dielectric constant and high capacitance, is useful.

According to an embodiment, a composition for depositing a thin film includes an organometallic compound including strontium, barium, or a combination thereof, and at least one unshared electron pair-containing compound represented by Chemical Formula 1.

$$R^1R^2R^3N \qquad \text{Chemical Formula 1}$$

In Chemical Formula 1, $R^1$ to $R^3$ are independently a substituted or unsubstituted C3 to C15 alkyl group.

For example, the organometallic compound may include one or more monovalent ligands, one or more divalent ligands, or a combination thereof.

For example, the organometallic compound may include two or more ligands, and for example, may include two or three ligands.

For example, the organometallic compound may include a substituted or unsubstituted cyclopentadiene-based ligand, a substituted or unsubstituted β-diketonate-based ligand, a substituted or unsubstituted ketoiminate-based ligand, a substituted or unsubstituted pyrrole-based ligand, a substituted or unsubstituted imidazole-based ligand, a substituted or unsubstituted amidinate-based ligand, a substituted or unsubstituted alkoxide-based ligand, a substituted or unsubstituted amide-based ligand, or a combination thereof.

For example, the organometallic compound may be represented by Chemical Formula 2.

$$M(A)_2 \qquad \text{Chemical Formula 2}$$

In Chemical Formula 2, M is an alkaline-earth metal and A is a substituted or unsubstituted cyclopentadiene-based ligand, a substituted or unsubstituted β-diketonate-based ligand, a substituted or unsubstituted ketoiminate-based ligand, a substituted or unsubstituted pyrrole-based ligand, a substituted or unsubstituted imidazole-based ligand, a substituted or unsubstituted amidinate-based ligand, a substituted or unsubstituted alkoxide-based ligand, a substituted or unsubstituted amide-based ligand, or a combination thereof.

For example, M may be strontium, barium, or a combination thereof.

For example, A may be (or may be derived from) a compound represented by Chemical Formula 3.

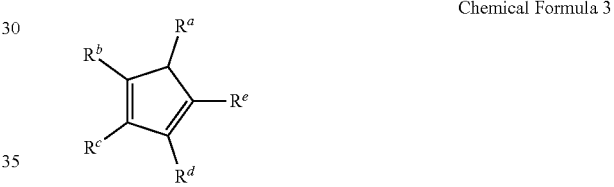

Chemical Formula 3

In Chemical Formula 3, $R^a$ to $R^e$ are each independently hydrogen, or a substituted or unsubstituted C1 to C20 alkyl group.

Without being bound by any particular mechanism or theory, in some embodiments of the organometallic compound represented by Chemical Formula 2, the two compounds A may be represented by Chemical Formula 3, M may be single-bonded with any one of carbon atoms constituting pentagonal rings of the two compounds represented by Chemical Formula 3, or M may be bonded with delocalized electron pairs of the five carbon atoms constituting the pentagonal rings of each of the two compounds represented by Chemical Formula 3 (for example, the organometallic compound represented by Chemical Formula 2 may be a sandwich complex in which M is sandwiched between the two compounds A which are bonded to M through a pentahapto ($\eta^5$-) bonding mode. For example, the organometallic compound represented by Chemical Formula 2 may be a metallocene, but the present disclosure is not limited thereto.

The substituted or unsubstituted C1 to C20 alkyl group may be, for example, a substituted or unsubstituted C1 to C15 alkyl group, for example, a substituted or unsubstituted C1 to C10 alkyl group, for example, a substituted or unsubstituted C1 to C6 alkyl group, for example, a substituted or unsubstituted C1 to C4 alkyl group, or a combination thereof. For example, the substituted or unsubstituted C1 to C20 alkyl group may be a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted hexyl group, a substituted or unsubstituted heptyl group, a substituted or unsubstituted octyl group, a substituted or unsubstituted nonyl group, a substituted or unsubstituted decyl group, or a combination thereof, but is not limited thereto.

For example, the substituted or unsubstituted C1 to C20 alkyl group may include a substituted or unsubstituted C1 to C20 linear alkyl group, a substituted or unsubstituted C3 to C20 branched alkyl group, or a combination thereof.

The C1 to C20 linear alkyl group may be a substituted or unsubstituted methyl group, a substituted or unsubstituted ethyl group, a substituted or unsubstituted n-propyl group, a substituted or unsubstituted n-butyl group, a substituted or unsubstituted n-pentyl group, a substituted or unsubstituted n-hexyl group, a substituted or unsubstituted n-heptyl group, a substituted or unsubstituted n-octyl group, or a combination thereof.

In addition, the substituted or unsubstituted branched C3 to C20 alkyl group may be a substituted or unsubstituted C3 to C20 iso-alkyl group, a substituted or unsubstituted C3 to C20 sec-alkyl group, a substituted or unsubstituted C4 to C20 tert-alkyl group, or a substituted or unsubstituted C5 to C20 neo-alkyl group. For example, the substituted or unsubstituted C3 to C20 branched alkyl group may be a substituted or unsubstituted iso-propyl group, a substituted or unsubstituted iso-butyl group, a substituted or unsubstituted sec-butyl group, a substituted or unsubstituted tert-butyl group, a substituted or unsubstituted iso-pentyl group, a substituted or unsubstituted sec-pentyl group, a substituted or unsubstituted tert-pentyl group or a substituted or unsubstituted neo-pentyl group, and desirably a substituted or unsubstituted iso-propyl group, a substituted or unsubstituted sec-butyl group, or a combination thereof.

For example, at least one selected from $R^a$ to $R^e$ may independently be a substituted or unsubstituted C1 to C20 alkyl group, at least two of $R^a$ to $R^e$ may independently be a substituted or unsubstituted C1 to C20 alkyl group, and 2 to 4 of $R^a$ to $R^e$ may independently be a substituted or unsubstituted C1 to C20 alkyl group. Herein, the substituted or unsubstituted C1 to C20 alkyl group is the same as described above.

For example, at least one selected from $R^a$ to $R^e$ may independently be a substituted or unsubstituted C3 to C20 branched alkyl group, at least two of $R^a$ to $R^e$ may independently be a substituted or unsubstituted C3 to C20 branched alkyl group, and 2 or 3 of $R^a$ to $R^e$ may independently be a substituted or unsubstituted C3 to C20 branched alkyl group. Herein, the substituted or unsubstituted branched C3 to C20 branched alkyl group is the same as described above.

For example, $R^b$, $R^c$, and $R^e$ may independently be a substituted or unsubstituted C3 to C20 branched alkyl group. Herein, the substituted or unsubstituted C3 to C20 branched alkyl group is the same as described above.

For example, $R^b$, $R^c$, and $R^e$ may independently be a substituted or unsubstituted C3 to C20 iso-alkyl group, a substituted or unsubstituted C3 to C20 sec-alkyl group, or a combination thereof.

For example, $R^b$, $R^c$, and $R^e$ may independently be a substituted or unsubstituted iso-propyl group, a substituted or unsubstituted iso-butyl group, a substituted or unsubstituted sec-butyl group, or a combination thereof.

For example, at least one selected from $R^a$ to $R^e$ may be hydrogen and for example, $R^a$ and $R^d$ may be hydrogen.

For example, $R^b$, and $R^e$ may be the same or different.

For example, two A's derived from Chemical Formula 3 (or two A's that are each represented by Chemical Formula 3) may be the same or different, but two A's may desirably be the same. In some embodiments, in Chemical Formula 3, $R^a$ may be the same or different, but may desirably be the same, $R^b$ may be the same or different, but may desirably be the same, $R^c$ may be the same or different, but may desirably be the same, $R^d$ may be the same or different, but may desirably be the same, and $R^e$ may be the same or different, but may desirably be the same.

For example, the organometallic compound represented by Chemical Formula 2 may be $Sr(iPr_3Cp)_2$, $Sr(tertBu_3Cp)_2$, $Sr(secBu_3Cp)_2$, $Sr(Me_5Cp)_2$, $Sr(Me_4,EtCp)_2$, $Sr(Me_4,nPrCp)_2$, $Sr(Me_4,nBuCp)_2$, $Sr(iPr_2,secBuCp)_2$, $Sr(iPr_2,Et_2Cp)_2$, $Sr(iBu,secBu_2Cp)_2$, or a combination thereof. Herein, "Cp" means a group derived from cyclopentadiene, "i" means iso, "sec" means secondary, "tert" means tertiary, "n" means normal, "Me" means a methyl group, "Et" means an ethyl group, "Pr" means a propyl group, and "Bu" means a butyl group, respectively.

The composition for depositing the thin film may include one or two or more of the aforementioned organometallic compounds, and, for example, may include one or two or more types (or kinds) of the organometallic compounds represented by Chemical Formula 2.

For example, the organometallic compound may be included in an amount in a range of about 10 wt % to about 90 wt %, for example, about 15 wt % to about 80 wt %, about 20 wt % to about 70 wt %, or about 25 wt % to about 60 wt % based on a total weight of the composition for depositing the thin film.

The organometallic compound including an alkaline-earth metal may be a solid or liquid at room temperature (e.g., at a temperature of about 20±5° C., about 1 atmosphere), and most of the organometallic compounds including an alkaline-earth metal exhibit a high dielectric constant while also having high viscosity and low volatility. For example, the organometallic compound may be a solid at room temperature (e.g., at a temperature of about 20±5° C., about 1 atmosphere) or liquid having a viscosity of greater than or equal to about 500 cps and/or low volatility. However, the aforementioned composition for depositing the thin film also includes the unshared electron pair-containing compound, and thus, may be a liquid exhibiting low viscosity and high volatility at room temperature (e.g., at a temperature of about 20±5° C., about 1 atmosphere). Accordingly, it may be easy to transport the composition for depositing the thin film through a fluid channel (e.g., by way of a Liquid Delivery System, LDS process) and the composition for depositing the thin film may be easily vaporized and deposited at a relatively low temperature.

For example, as described above, the unshared electron pair-containing compound may be represented by Chemical Formula 1. In Chemical Formula 1, $R^1$ to $R^3$ may be the same or different, but $R^1$ to $R^3$ may desirably be the same.

For example, $R^1$ to $R^3$ may independently be a substituted or unsubstituted C4 to C13 alkyl group, for example, a substituted or unsubstituted C4 to C10 alkyl group, for example, a substituted or unsubstituted C4 to C8 alkyl group, for example, a substituted or unsubstituted C5 to C13 alkyl group, for example, a substituted or unsubstituted C6 to C13 alkyl group, for example, a substituted or unsubstituted C7 to C13 alkyl group, for example, a substituted or unsubstituted C7 to C8 alkyl group, or a combination thereof.

For example, $R^1$ to $R^3$ may independently be a substituted or unsubstituted pentyl group, a substituted or unsubstituted hexyl group, a substituted or unsubstituted heptyl group, a substituted or unsubstituted octyl group, a substituted or unsubstituted nonyl group, or a substituted or unsubstituted decyl group.

For example, the unshared electron pair-containing compound may be tripentylamine, trihexylamine, triheptylamine, trioctylamine, trinonylamine, or a combination thereof.

For example, the unshared electron pair-containing compound may be a liquid at room temperature (e.g., at a temperature of about 20±5° C., about 1 atmosphere), and the viscosity of the liquid unshared electron pair-containing compound may be different from that of the organometallic compound, and it may desirably be lower than the viscosity of the organometallic compound.

For example, the unshared electron pair-containing compound may have a viscosity of less than or equal to about 100 cps, for example, the viscosity may be in a range of about 1 cps to about 75 cps, about 1 cps to about 50 cps, or about 1 cps to about 25 cps.

For example, when performing thermogravimetric analysis at 1 atmosphere under an Ar (argon) gas atmosphere, a temperature at which a 50% weight loss relative to an initial weight of the unshared electron pair-containing compound occurs may be greater than or equal to about 150° C., for example, the temperature may be in a range of about 150° C. to about 400° C., about 175° C. to about 350° C., or about 200° C. to about 300° C.

The composition for depositing the thin film may include one or more types (or kinds) of the aforementioned unshared electron pair-containing compound, and, for example, may include one or more types (or kinds) of the aforementioned unshared electron pair-containing compound represented by Chemical Formula 1.

For example, the unshared electron pair-containing compound may be included in an amount in a range of about 10 wt % to about 90 wt %, for example, about 15 wt % to about 80 wt %, about 20 wt % to about 70 wt %, or about 25 wt % to about 60 wt % based on a total weight of the composition for depositing the thin film. Accordingly, it may be easy to transport the composition for depositing the thin film through a fluid channel (e.g., by way of a Liquid Delivery System, LDS process).

An equivalent ratio ($m^2/m^1$) of the organometallic compound ($m^1$) and the unshared electron pair-containing compound ($m^2$) may be in a range of about 0.1 to about 5, for example, about 0.25 to about 4, about 0.4 to about 3, or about 0.5 to about 2. Accordingly, it may be easy to transport the composition for depositing the thin film through a fluid channel (e.g., by way of a Liquid Delivery System, LDS process).

When performing thermogravimetric analysis at 1 atmosphere under an Ar (argon) gas atmosphere, a difference between a temperature at which a 50% weight loss relative to an initial weight of the organometallic compound occurs and a temperature at which a 50% weight loss relative to an initial weight of the unshared electron pair-containing compound occurs may be less than or equal to about 90° C., for example, the difference may be in a range of about 0° C. to about 90° C., about 0° C. to about 70° C., or about 0° C. to about 60° C.

Accordingly, when the composition for depositing the thin film is vaporized, instead of having one selected from the organometallic compound and the unshared electron pair-containing compound vaporized first and the other not vaporized (2-step vaporization), the organometallic compound and the unshared electron pair-containing compound are vaporized together (1-step vaporization) to make it be uniformly (e.g., substantially uniformly) deposited. Thus, according to embodiments of the disclosure, the composition for depositing the thin film is vaporized in a 1-step vaporization process to more uniformly deposit the thin film.

For example, when performing thermogravimetric analysis at 1 atmosphere under an Ar (argon) gas atmosphere, a temperature at which a 50% weight loss relative to an initial weight of the composition for depositing the thin film occurs may be lower than a temperature at which a 50% weight loss relative to an initial weight of the organometallic compound occurs, and a temperature at which a 50% weight loss relative to an initial weight of the unshared electron pair-containing compound occurs. In some embodiments, the volatility of the composition for depositing the thin film may be higher than the volatility of each of the organometallic compound and the unshared electron pair-containing compound included in the composition for depositing the thin film. Accordingly, the composition for depositing the thin film may be easily vaporized and deposited at a relatively low temperature, and a uniform (e.g., substantially uniform) thin film may be formed.

For example, the viscosity of the composition for depositing the thin film may be less than or equal to about 500 cps, for example, less than or equal to about 300 cps, less than or equal to about 200 cps, less than or equal to about 100 cps, or less than or equal to about 50 cps, for example, the viscosity may be in a range of about 1 cps to about 300 cps, about 1 cps to about 200 cps, about 1 cps to about 100 cps, or about 1 cps to about 50 cps. Accordingly, it may be easy to transport the composition for depositing the thin film through a fluid channel (e.g., by way of a Liquid Delivery System, LDS process).

The aforementioned composition for depositing the thin film may further include other compounds in addition to the aforementioned organometallic compound and unshared electron pair-containing compound.

The aforementioned composition for depositing the thin film may be a composition for depositing a first thin film.

According to another embodiment, a method of manufacturing a thin film includes vaporizing a composition for depositing a first thin film and depositing the vaporized composition for depositing the first thin film on a substrate.

For example, the vaporizing of the composition for depositing the first thin film may include providing the composition for depositing the first thin film to the first reactor, and the providing of the composition for depositing the first thin film to the first reactor may include providing the composition for depositing the first thin film to the first reactor through a fluid channel.

For example, the vaporizing of the composition for depositing the first thin film may include heating the composition for depositing the first thin film at (or to) a temperature of less than or equal to about 300° C., for example, heating the composition for depositing the first thin film at (or to) a temperature in a range of about 50° C. to about 300° C., about 50° C. to about 250° C., or about 50° C. to about 200° C.

For example, the method of manufacturing the thin film may further include vaporizing a composition for depositing a second thin film, and depositing the vaporized composition for depositing the second thin film on the substrate.

The composition for depositing the second thin film may include a second organometallic compound including titanium, zirconium, hafnium, niobium, tantalum, or a combination thereof and the second organometallic compound may include a substituted or unsubstituted cyclopentadiene-based ligand, a substituted or unsubstituted β-diketonate-based ligand, a substituted or unsubstituted ketoiminate-based ligand, a substituted or unsubstituted pyrrole-based ligand, a substituted or unsubstituted imidazole-based ligand, a substituted or unsubstituted amidinate-based ligand, a substituted or unsubstituted alkoxide-based ligand, a substituted or unsubstituted amide-based ligand, or a combination thereof.

The composition for depositing the second thin film may or may not further include a solvent in addition to the second organometallic compound, and when the solvent is not further included, the second organometallic compound may be in a liquid state at room temperature (e.g., at a temperature of about 20±5° C., about 1 atmosphere). When the composition for depositing the second thin film further includes a solvent, the solvent may include an organic solvent, for example, a polar solvent such as diethyl ether, petroleum ether, tetrahydrofuran, and/or 1,2-dimethoxyethane. When the organic solvent is included, it may be included in a mole ratio of 2 times that of the organometallic compound. Thereby, the organometallic compound included in the composition for depositing the thin film may be coordinated by the organic solvent to improve the stability of the organometallic compound. Thus, it is possible to suppress or reduce the formation of oligomers formed by reacting the central metal atom included in the organometallic compound with other organometallic compounds around it. In addition, the composition for depositing the thin film including the organic solvent may further increase a vapor pressure of the organometallic compound present as a monomolecule.

For example, the vaporizing of the composition for depositing the second thin film may include providing the composition for depositing the second thin film to the first reactor and/or a second reactor different from the first reactor (e.g., via a fluid channel).

For example, the vaporizing of the composition for depositing the second thin film may include heating the composition for depositing the second thin film at (or to) a temperature of less than or equal to about 200° C., for example, heating the composition for depositing the second thin film at (or to) a temperature in a range of about 30° C. to about 200° C., about 30° C. to about 175° C., or about 30° C. to about 150° C.

For example, the composition for depositing the first thin film and the composition for depositing the second thin film may be vaporized together or independently. When the composition for depositing the first thin film and the composition for depositing the second thin film are each independently vaporized, the vaporized composition for depositing the first thin film and the vaporized composition for depositing the second thin film may be deposited on a substrate together or independently, and they may be, for example, deposited alternately.

For example, the depositing of the vaporized composition for depositing the first thin film on the substrate may further include reacting the vaporized composition for depositing the first thin film with a reaction gas (e.g., a first reaction gas) and the depositing of the vaporized composition for depositing the second thin film on the substrate may further include reacting the vaporized composition for depositing the second thin film with a reaction gas (e.g., a second reaction gas, which may be the same as or different from the first reaction gas).

For example, the reaction gas may include an oxidizing agent such as, for example, aqueous vapor ($H_2O$), oxygen ($O_2$), ozone ($O_3$), plasma, hydrogen peroxide ($H_2O_2$), ammonia ($NH_3$), hydrazine ($N_2H_4$), or a combination thereof.

The deposition method is not particularly limited, but the method of manufacturing the thin film described above may be performed using an atomic layer deposition (ALD) and/or a metal organic chemical vapor deposition (MOCVD) method. For example, the depositing of the vaporized composition for depositing the first thin film, and/or the vaporized composition for depositing the second thin film on the substrate may be performed by using an atomic layer deposition (ALD) and/or a metal organic chemical vapor deposition (MOCVD) method.

For example, the depositing of the vaporized composition for depositing the first thin film, and/or the vaporized composition for depositing the second thin film on the substrate may be performed at a temperature in a range of about 100° C. to about 1000° C.

According to another embodiment, a thin film manufactured using the composition for depositing the thin film according to an embodiment is provided. The thin film may be a thin film manufactured by the method of manufacturing a thin film according to an embodiment of the present disclosure.

For example, the thin film may be a perovskite thin film. In some embodiments, the thin film may include a strontium titanium oxide, a barium strontium titanium oxide, a rubidium strontium oxide, a cerium strontium oxide, or a combination thereof. In some embodiments, the thin film may include $SrTiO_3$, $Ba_xSr_{1-x}TiO_3$ (wherein, x is 0.1 to 0.9), $SrRuO_3$, $SrCeO_3$, or a combination thereof.

For example, a thickness of the thin film may be less than about 10 nm, and the dielectric constant value of the thin film may be greater than or equal to about 50. Accordingly, the thin film may have a uniform (e.g., substantially uniform) thickness and excellent leakage current characteristics while also forming a fine pattern.

The thin film may be a uniform (e.g., substantially uniform) thin film exhibiting a high dielectric constant and excellent insulating properties, and the thin film can be used to achieve high capacitance. Accordingly, the thin film may be an insulating layer, and the insulating layer may be included in an electric and/or electronic device. The electric and/or electronic device may be a semiconductor device, and the semiconductor device may be, for example, a dynamic random-access memory (DRAM).

According to another embodiment, a semiconductor device including a thin film according to an embodiment is provided. Because the semiconductor device includes a thin film according to an embodiment, electrical characteristics and reliability may be improved.

Hereinafter, embodiments of the present disclosure are illustrated in more detail with reference to examples. However, these examples are exemplary, and the scope of claims is not limited thereto.

Preparation of Composition for Depositing Thin Film

Examples 1-1 to 1-7 and Comparative Example 1

Compositions for depositing a thin film (liquid at room temperature) were respectively prepared to have the compositions shown in Table 1 by mixing an organometallic compound of Chemical Formula 2-1 (SR8820, Ereztech LLC.; TGA 50 wt % weight loss temperature=265° C., a solid at room temperature) and triheptylamine (10361, TCI (Tokyo Chemical Industry); TGA 50 wt % weight loss temperature=243° C., liquid at room temperature) and then, stirring the resultant mixture.

Chemical Formula 2-1

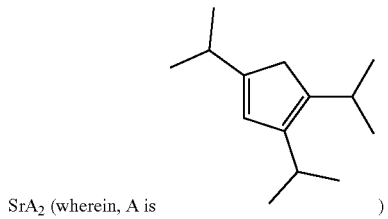

$SrA_2$ (wherein, A is ⟨structure⟩)

TABLE 1

|  | Organometallic compound (g) | Unshared electron pair-containing compound (triheptylamine) (g) | Equivalent ratio ($m^2/m^1$) | Content of unshared electron pair-containing compound (wt %) | TGA loss behavior | Viscosity (cps) |
| --- | --- | --- | --- | --- | --- | --- |
| Comparative Example 1 | 1.00 | 0.00 | 0.0 | 0.00 | One step | 916 |
| Example 1-1 | 1.00 | 0.17 | 0.25 | 14.20 | One step | 89.1 |
| Example 1-2 | 1.00 | 0.33 | 0.50 | 24.87 | One step | 41.5 |
| Example 1-3 | 1.00 | 0.50 | 0.75 | 33.18 | One step | 26.5 |
| Example 1-4 | 1.00 | 0.66 | 1.0 | 39.83 | One step | 21.1 |
| Example 1-5 | 1.00 | 1.32 | 2.0 | 56.97 | One step | 11.6 |
| Example 1-6 | 1.00 | 1.99 | 3.0 | 66.51 | One step | 9.3 |
| Example 1-7 | 1.00 | 3.31 | 5.0 | 76.80 | One step | 7.3 |

Examples 2-1 to 2-7

Compositions for depositing a thin film (liquid at room temperature) were respectively prepared to have the compositions shown in Table 2 by mixing an organometallic compound of Chemical Formula 2-1 and trioctylamine (10362, TCI (Tokyo Chemical Industry); TGA 50 wt % weight loss temperature=269° C., liquid at room temperature) and then, stirring the resultant mixture.

TABLE 2

|  | Organometallic compound (g) | Unshared electron pair-containing compound (trioctylamine) (g) | Equivalent ratio ($m^2/m^1$) | Content of unshared electron pair-containing compound (wt %) | TGA loss behavior | Viscosity (cps) |
| --- | --- | --- | --- | --- | --- | --- |
| Example 2-1 | 2.00 | 0.35 | 0.25 | 14.89 | One step | 94.8 |
| Example 2-2 | 2.00 | 0.75 | 0.50 | 27.28 | One step | 45.2 |
| Example 2-3 | 2.00 | 1.13 | 0.75 | 36.10 | One step | 30.1 |
| Example 2-4 | 1.00 | 0.75 | 1.0 | 42.86 | One step | 25.4 |
| Example 2-5 | 1.00 | 1.50 | 2.0 | 60.00 | One step | 15.9 |
| Example 2-6 | 1.00 | 2.26 | 3.0 | 69.33 | One step | 12.3 |
| Example 2-7 | 1.00 | 3.76 | 5.0 | 78.99 | One step | 10.3 |

Comparative Examples 2-1 to 2-7

Compositions for depositing a thin film (liquid at room temperature) were prepared to respectively have the compositions shown in Table 3 by mixing the organometallic compound of Chemical Formula 2-1 and triethylamine (I0424, TCI (Tokyo Chemical Industry); TGA 50 wt % weight loss temperature=40.4° C., liquid at room temperature) and then, stirring the resultant mixture.

TABLE 3

| | Organometallic compound (g) | Unshared electron pair-containing compound (triethyl Amine) (g) | Equivalent ratio ($m^2/m^1$) | Content of unshared electron pair-containing compound (wt %) | TGA loss behavior | Viscosity (cps) |
|---|---|---|---|---|---|---|
| Comparative Example 2-1 | 2.00 | 0.11 | 0.25 | 5.10 | two steps | 86.3 |
| Comparative Example 2-2 | 2.00 | 0.21 | 0.50 | 9.71 | two steps | 39.2 |
| Comparative Example 2-3 | 2.00 | 0.32 | 0.75 | 13.90 | two steps | 24.8 |
| Comparative Example 2-4 | 1.00 | 0.22 | 1.0 | 17.71 | two steps | 18.8 |
| Comparative Example 2-5 | 1.00 | 0.43 | 2.0 | 30.09 | two steps | 9.42 |
| Comparative Example 2-6 | 1.00 | 0.65 | 3.0 | 39.23 | two steps | 6.44 |
| Comparative Example 2-7 | 1.00 | 1.08 | 5.0 | 52.83 | two steps | 3.95 |

Evaluation 1

The compositions for depositing a thin film according to the examples and comparative examples were measured with respect to viscosity under the following conditions, and the results are shown in Tables 1 to 3 and FIG. 1.
Viscosity Measurement Conditions
  Viscosity meter: RVDV-II (BROOKFIELD Company)
  Spindle No.: CPA-40Z
  Torque/RPM: 20 to 80% Torque/1-100 RPM
  Measurement temperature (sample cup temperature): 25° C.

Referring to Tables 1 to 3 and FIG. 1, the compositions for depositing a thin film according to Examples 1-1 to 2-7 and Comparative Example 1 had viscosity low enough to be delivered through a fluid channel (a liquid delivery system).
Evaluation 2

The compositions for depositing a thin film according to the examples and the comparative examples were evaluated utilizing a thermogravimetric analysis (TGA) method under an Ar (argon) gas atmosphere at 1 atm of pressure. (Measurement equipment: TG209F3, Netzsch-Gerätebau GmbH)

The compositions for depositing a thin film according to the examples and the comparative examples were respectively taken by 20±2 mg and then, put in an alumina sample container, and weight change rates thereof were measured, while each composition for depositing a thin film was heated up to 500° C. at 10° C./min.

In addition, the compositions for depositing a thin film according to the examples and the comparative examples were respectively taken in amounts of 20±2 mg and then, put in an alumina sample container, and weight change rates thereof depending on time were measured, while each composition for depositing a thin film was maintained at 500° C.

The weight change rate is a value calculated by Calculation Equation 1.

Weight change rate (%)=(weight after heat treatment/initial weight)×100%      Calculation Equation 1

Figure 2:
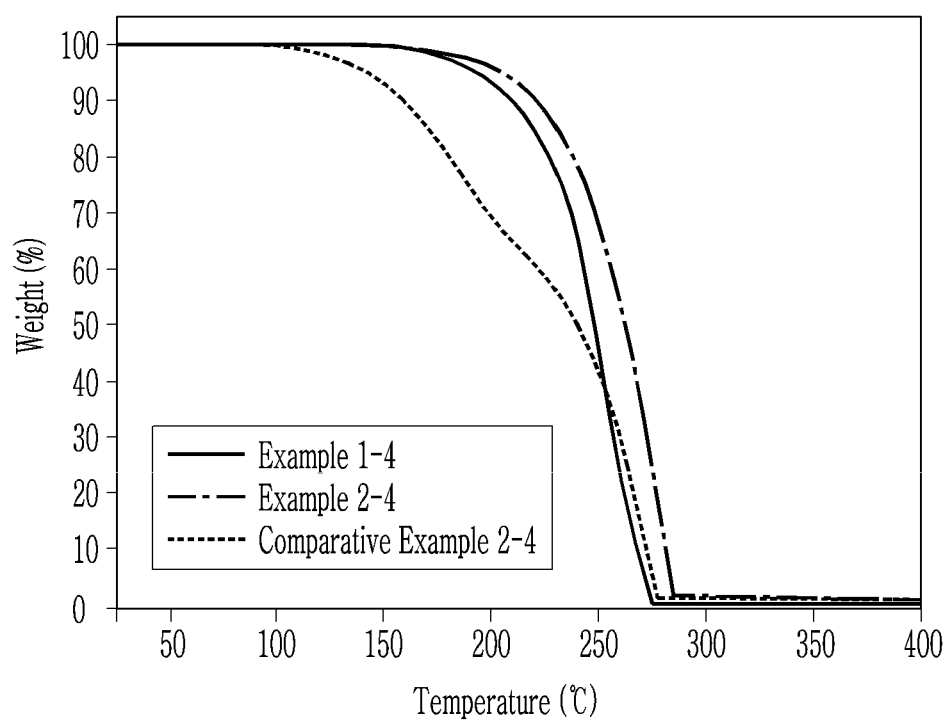
FIG. 2 is a graph showing weight change rates according to a temperature of the composition for depositing the thin film according to Examples 1-4, 2-4, and Comparative Example 2-4.
Figure 3:
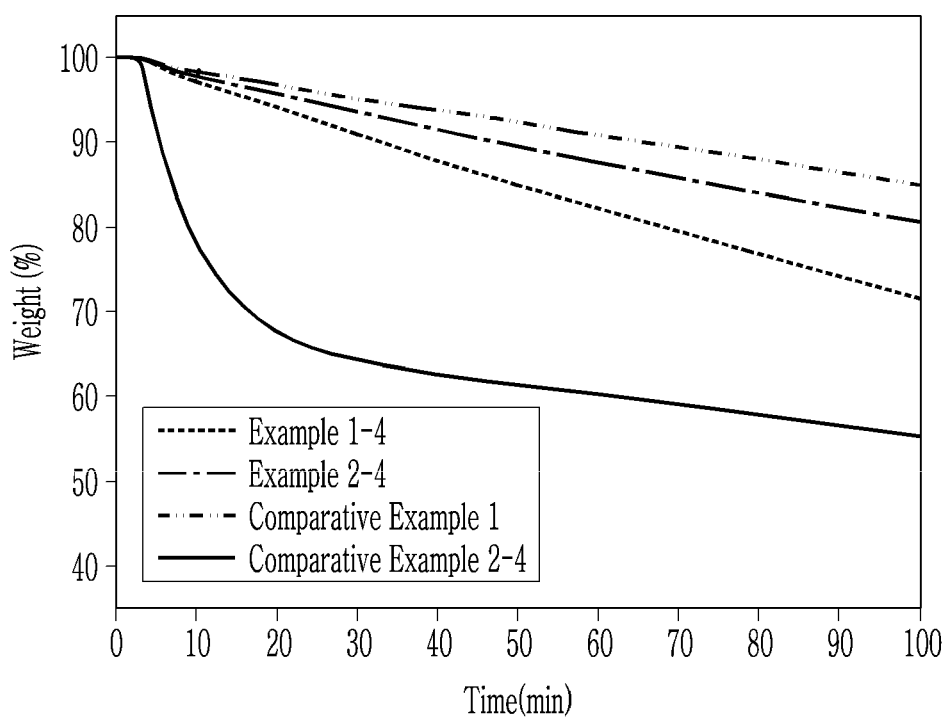
FIG. 3 is a graph showing weight change rates over time at 500° C. of the compositions for depositing the thin film according to Examples 1-4, 2-4, and Comparative Examples 1, and 2-4.

The weight change rates of the compositions for depositing a thin film according to the examples and the comparative examples are shown in FIG. 2, and the weight change rates of the compositions for depositing a thin film according to the examples and the comparative examples at 500° C. depending on time are shown in Tables 1 to 3 and FIG. 3.

Referring to FIG. 2, the compositions for depositing a thin film according to Examples 1-4 and 2-4 exhibited a 50% weight loss relative to each initial weight at a lower temperature than those at which each organometallic compound and each unshared electron pair-containing compound included in the compositions for depositing the thin film exhibited a 50% weight loss relative to each initial weight.

In addition, referring to Tables 1 to 3 and FIGS. 2 and 3, the compositions for depositing a thin film according to the examples exhibited a one-step volatilization behavior (one-step vaporization), while the compositions of Comparative Example 2-1 to 2-7 exhibited a double volatilization behavior (two-step vaporization), in which either one selected from the organometallic compound and the unshared electron pairs included in each composition for depositing a thin film was volatilized, and then, the other one was volatilized.

In addition, in FIG. 3, because the compositions for depositing a thin film according to Examples 1-4 and 2-4 exhibited a larger absolute value of slope than that of Comparative Example 1, the compositions for depositing a thin film including the organometallic compound and the unshared electron pair-containing compound of Chemical Formula 1 according to the examples exhibited excellent volatility compared with the composition for depositing a thin film including the organometallic compound alone.

In summary, referring to Tables 1 to 3 and FIGS. 1 to 3, the composition for depositing a thin film according to an embodiment of the present disclosure were more suitable or appropriate for depositing a uniform (e.g., substantially uniform) thin film.

Manufacture of Thin Films

The compositions for depositing a thin film according to Examples 1-1 to 2-7 were charged respectively to 200 g in a bubbler-type 300 cc canister and formed into thin films by using ALD equipment.

In order to suitably supply the compositions for depositing a thin film, the canister was heated up to 50° C. to 150° C., and in order to prevent or reduce condensation of the composition for depositing a thin film in a pipe coupled to the canister, the pipe was heated to a temperature greater than or equal to 10° C. higher than the canister. Herein, as carrier gas, Ar gas having high purity (99.999%) was used, and while flowing the Ar gas at 50 to 500 sccm, the compositions for depositing a thin film were supplied. Subsequently, as an oxidizing agent reaction gas, ozone gas was flowed at 100 sccm to 500 sccm, and while the temperature of the silicon substrate was changed into 200° C. to 450° C., thin films were respectively deposited on the silicon substrate. The deposited thin films were heat-treated at 650° C. for several minutes by using RTA (rapid thermal anneal) equipment.

The thin films exhibited growth per cycle (GPC) of 1.06±0.02 Å/cycle depending on a deposition cycle and thickness uniformity of 5.0±0.5%, and in the thin films grown at greater than or equal to 340° C., a crystalline phase was observed.

Hereinbefore, certain exemplary embodiments of the present disclosure have been described and illustrated, however, it will be apparent to a person having ordinary skill in the art that the present disclosure is not limited to the exemplary embodiments as described herein, and may be variously modified and transformed without departing from the spirit and scope of the present disclosure. Accordingly, the modified or transformed exemplary embodiments as such may not be understood separately from the technical ideas and aspects of embodiments of the present disclosure, and the modified exemplary embodiments are within the scope of the appended claims, and equivalents thereof.

What is claimed is:

1. A composition for depositing a thin film, the composition comprising:
   an organometallic compound including strontium, barium, or a combination thereof, and
   at least one unshared electron pair-containing compound represented by Chemical Formula 1:

$$R^1R^2R^3N \quad\quad \text{Chemical Formula 1}$$

wherein, in Chemical Formula 1, $R^1$ to $R^3$ are each independently a substituted or unsubstituted C3 to C15 alkyl group, and
   wherein the composition for depositing the thin film has a viscosity of less than or equal to about 500 cps when measured at a sample cup temperature of 25° C. and a torque/RPM ratio of 20-80% Torque/1-100 RPM.

2. The composition of claim 1, wherein the organometallic compound comprises a substituted or unsubstituted cyclopentadiene-based ligand, a substituted or unsubstituted β-diketonate-based ligand, a substituted or unsubstituted ketoiminate-based ligand, a substituted or unsubstituted pyrrole-based ligand, a substituted or unsubstituted imidazole-based ligand, a substituted or unsubstituted amidinate-based ligand, a substituted or unsubstituted alkoxide-based ligand, a substituted or unsubstituted amide-based ligand, or a combination thereof.

3. The composition of claim 1, wherein the organometallic compound is represented by Chemical Formula 2:

$$M(A)_2 \quad\quad \text{Chemical Formula 2}$$

wherein, in Chemical Formula 2,
M is Sr or Ba, and
A is derived from a compound represented by Chemical Formula 3,

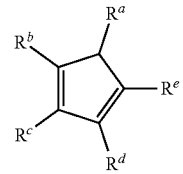

Chemical Formula 3 wherein, in Chemical Formula 3,
$R^a$ to $R^e$ are each independently hydrogen, or a substituted or unsubstituted C1 to C20 alkyl group.

4. The composition of claim 3, wherein at least one selected from $R^a$ to $R^e$ is a substituted or unsubstituted C3 to C30 branched alkyl group.

5. The composition of claim 1, wherein in Chemical Formula 1, $R^1$ to $R^3$ are the same.

6. The composition of claim 1, wherein $R^1$ to $R^3$ are each independently a substituted or unsubstituted pentyl group, a substituted or unsubstituted hexyl group, a substituted or unsubstituted heptyl group, a substituted or unsubstituted octyl group, a substituted or unsubstituted nonyl group, or a substituted or unsubstituted decyl group.

7. The composition of claim 1, wherein the unshared electron pair-containing compound is included in an amount in a range of about 10 wt % to about 90 wt % based on a total weight of the composition for depositing the thin film.

8. The composition of claim 1, wherein an equivalent ratio $(m^2/m^1)$ of moles of the organometallic compound $(m^1)$ and moles of the unshared electron pair-containing compound $(m^2)$ is in a range of about 0.1 to about 5.

9. The composition of claim 1, wherein when measured using a thermogravimetric analysis at 1 atmosphere of pressure under an Ar (argon) gas atmosphere, a difference between a temperature at which a 50% weight loss relative to an initial weight of the organometallic compound occurs and a temperature at which a 50% weight loss relative to an initial weight of the unshared electron pair-containing compound occurs is less than or equal to about 90° C.

10. The composition of claim 1, wherein when measured using thermogravimetric analysis at 1 atmosphere of pressure under an Ar (argon) gas atmosphere, a temperature at which a 50% weight loss relative to an initial weight of the composition for depositing the thin film occurs is lower than:
   a temperature at which a 50% weight loss relative to an initial weight of the organometallic compound occurs, and a temperature at which a 50% weight loss relative to an initial weight of the unshared electron pair-containing compound occurs.

11. A method of manufacturing a thin film, comprising:
   vaporizing the composition for depositing the thin film of claim 1, and
   depositing the vaporized composition for depositing the thin film on a substrate to form the thin film,
   wherein the thin film is a first thin film.

12. The method of claim 11, wherein:
the method of manufacturing the thin film further comprises:
vaporizing a composition for depositing a second thin film, and
depositing the vaporized composition for depositing the second thin film on the substrate to form the second thin film,
wherein the composition for depositing the second thin film comprises a second organometallic compound including titanium, zirconium, hafnium, niobium, tantalum, or a combination thereof.

13. The method of claim 12, wherein the vaporized composition for depositing the thin film and the vaporized composition for depositing the second thin film are deposited together or independently of each other on a substrate.

14. The method of claim 12, wherein:
the depositing of the vaporized composition for depositing the thin film on a substrate further comprises reacting the vaporized composition for depositing the thin film with a reaction gas, and
the reaction gas comprises aqueous vapor ($H_2O$), oxygen ($O_2$), ozone ($O_3$), plasma, hydrogen peroxide ($H_2O_2$), ammonia ($NH_3$), hydrazine ($N_2H_4$), or a combination thereof.

15. The method of claim 12, wherein the depositing of the vaporized composition for depositing the thin film on a substrate is performed using an atomic layer deposition (ALD) or a metal organic chemical vapor deposition (MOCVD) method.

16. The method of claim 11, wherein the vaporizing of the composition for depositing the thin film comprises heating the composition for depositing the thin film at a temperature of less than or equal to about 300° C.

17. A thin film manufactured from the composition for depositing the thin film of claim 1.

18. A semiconductor device comprising the thin film of claim 17.

* * * * *